United States Patent
Park et al.

(10) Patent No.: US 7,344,944 B2
(45) Date of Patent: Mar. 18, 2008

(54) NON-VOLATILE MEMORY DEVICE AND FABRICATING METHOD THEREOF

(75) Inventors: Kyu-Charn Park, Kyungki-do (KR); Kwang-Shik Shin, Seoul (KR); Sung-Nam Chang, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 45 days.

(21) Appl. No.: 11/341,073

(22) Filed: Jan. 27, 2006

(65) Prior Publication Data

US 2006/0128070 A1 Jun. 15, 2006

Related U.S. Application Data

(62) Division of application No. 10/797,754, filed on Mar. 9, 2004, now Pat. No. 7,061,044.

(30) Foreign Application Priority Data

Mar. 10, 2003 (KR) .............................. 2003-14853

(51) Int. Cl.
*H01L 21/336* (2006.01)

(52) U.S. Cl. ............................. 438/266; 257/E21.179
(58) Field of Classification Search ............... 438/266; 257/E21.179, E21.176, E21.177, E21.178, 257/E21.422, E21.68

See application file for complete search history.

(56) References Cited

U.S. PATENT DOCUMENTS

| 4,780,431 A | 10/1988 | Maggioni |
| 5,894,146 A | 4/1999 | Pio et al. |
| 6,221,717 B1 | 4/2001 | Cremonesi et al. |
| 6,541,324 B1 * | 4/2003 | Wang .......................... 438/201 |

FOREIGN PATENT DOCUMENTS

CN 1345466 A 4/2002

* cited by examiner

*Primary Examiner*—Lex Malsawma
(74) *Attorney, Agent, or Firm*—Marger Johnson & McCollom, P.C.

(57) ABSTRACT

A non-volatile memory device comprises a gate line that includes a gate dielectric layer, a bottom gate pattern, an inter-gate dielectric and a top gate pattern, which are sequentially stacked. The width of the inter-gate dielectric is narrower than that of the bottom gate pattern.

11 Claims, 21 Drawing Sheets

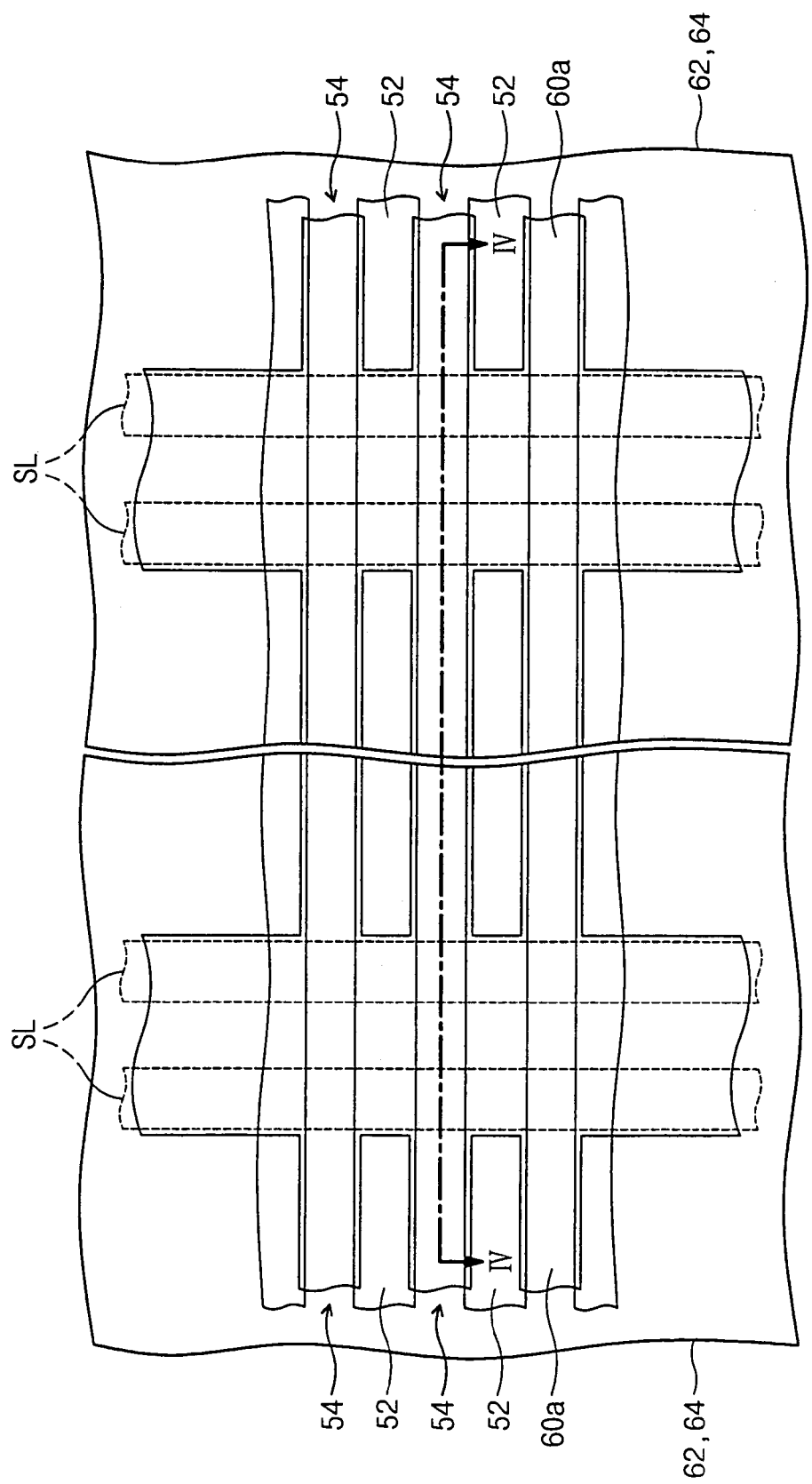

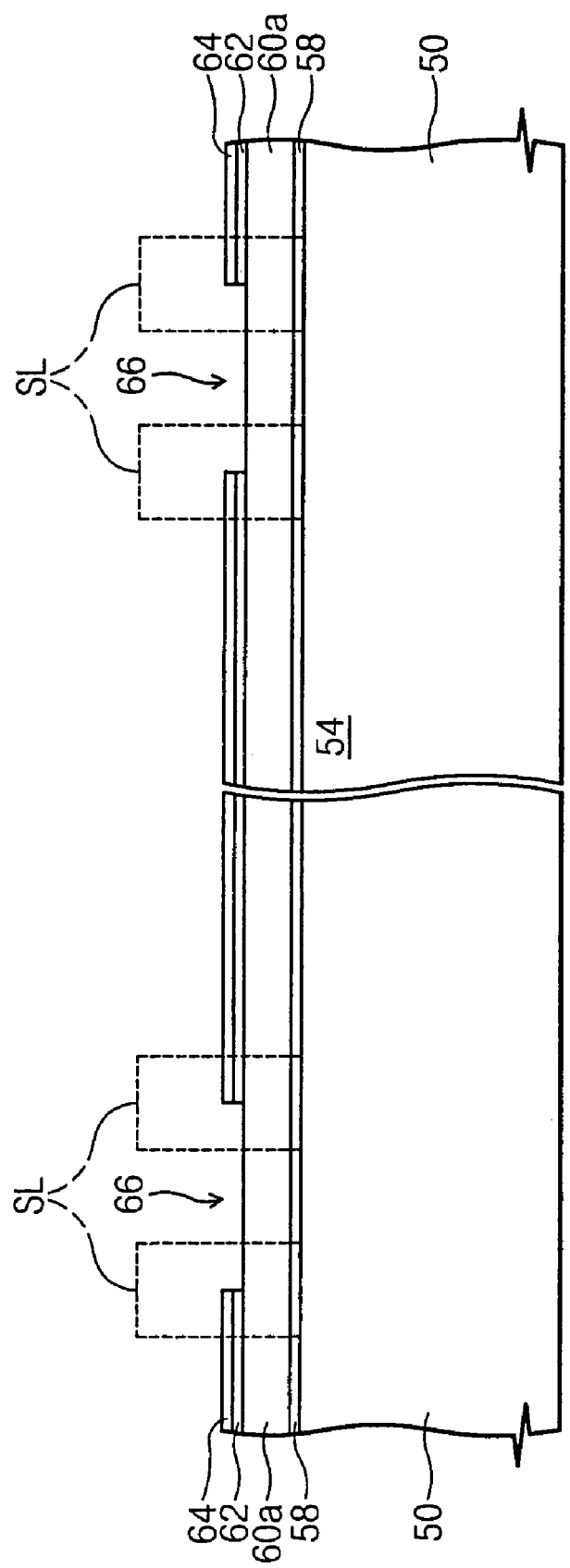

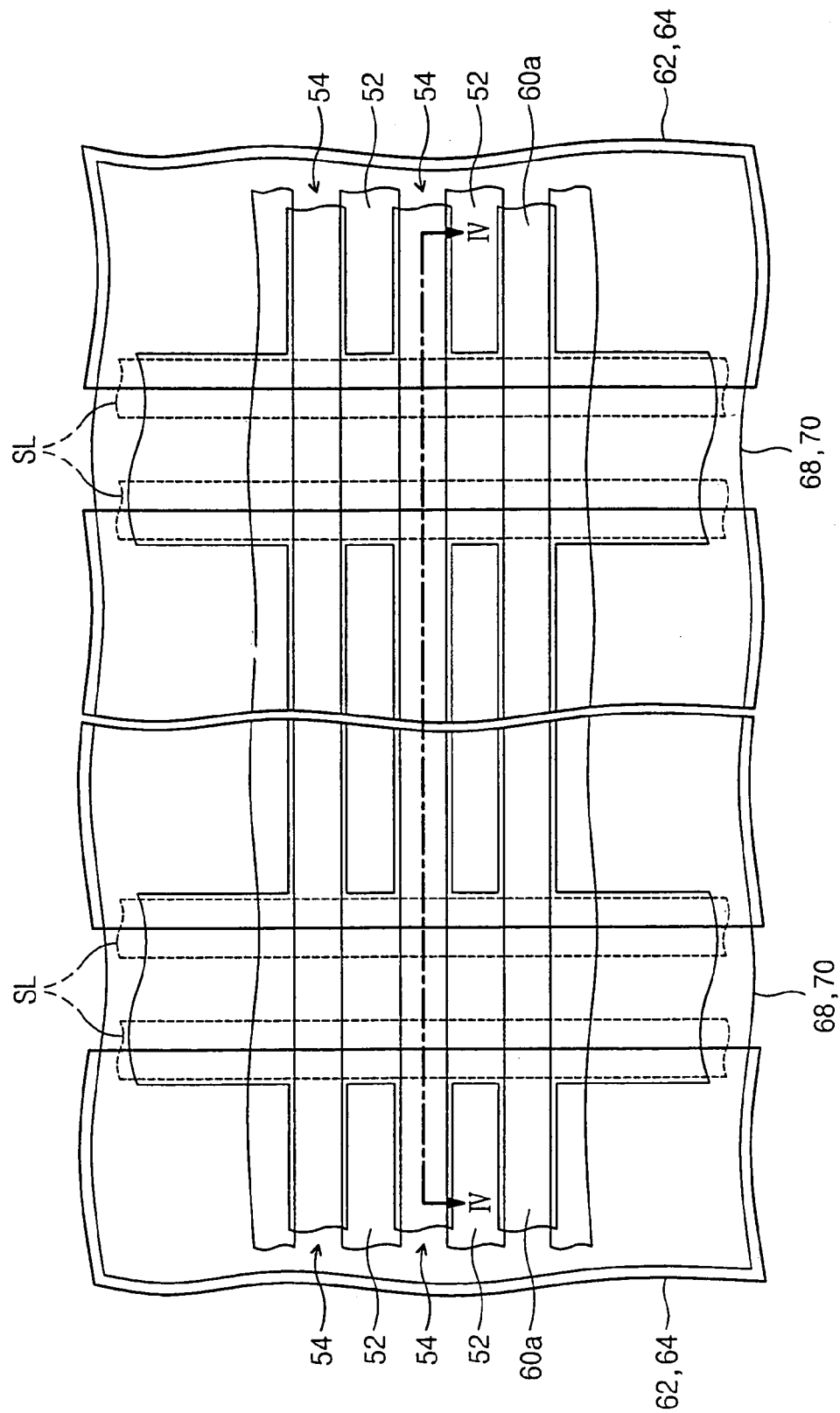

NON-VOLATILE MEMORY DEVICE AND FABRICATING METHOD THEREOF

This application is a divisional of U.S. patent application Ser. No. 10/797,754, filed Mar. 9, 2004, now U.S. Pat. No. 7,061,044, which is claims priority from Korean Patent Application No. 2003-0014853 filed on Mar. 10, 2003, in the Korean Intellectual Property Office, the disclosure of which is incorporated herein in its entirety by reference.

BACKGROUND OF THE INVENTION

1. Field of the Invention

The present invention relates to a semiconductor device and a fabricating method thereof, and more particularly, to a non-volatile memory device and a fabricating method thereof.

2. Description of the Related Art

A non-volatile memory device such as an electrically-erasable-programmable read-only-memory (EEPROM) is a read only memory (ROM) that can be erased and reprogrammed through the application of electrical voltage. Typical examples of the EEPROM are a flash memory device and a floating gate tunnel oxide (FLOTOX) memory device. FLOTOX memory device employ memory cells comprising two transistors, that is, a memory transistor and a selection transistor. A cell array of the flash memory device may be classified into a NAND-type cell array and NOR-type cell array. In the NAND-type cell array, cell strings are arranged in parallel in a cell array region. The cell strings comprise a plurality of memory cells, which are connected in series. The cell strings of the NAND-type cell array include the selection transistor on both ends thereof. While the selection transistor of the FLOTOX memory cell selects the memory cell, the selection transistor of the NAND-type flash memory cell selects the string cells.

Referring to FIG. 1, in the conventional NAND-type flash memory device, a device isolation layer 2 is formed on a semiconductor substrate 10. The device isolation layer 2 defines a plurality of active regions 4 in the substrate 10. A string selection line (SSL), a ground selection line (GSL) and a plurality of word lines (WL) intersecting the active regions 4 are arranged. The string selection line (SSL), the ground selection line (GSL) and a plurality of word lines (WL) constitute a memory cell unit (i.e., Block). The NAND-type cell array comprises a plurality of the memory cell units. Adjoining memory cell units are arranged symmetrically. Common source line (CSL) is arranged between the ground selection lines (GSL). The common source line (CSL) is electrically connected to the active regions 4. A bit line plug 44 is arranged on each active region 4 between the string selection lines (SSL).

The word lines (WL) comprise a control gate electrode 49 and a floating gate 32. The control gate electrode 49 extends across the active regions 4, and the floating gate 32 interposed between the control gate electrode 49 and each active region 4. The ground selection line (GSL) and the string selection line (SSL) comprise a bottom gate pattern 24 and a top gate pattern 30, which are sequentially stacked. The word line (WL) includes an inter-gate dielectric. The inter-gate dielectric electrically insulates the control gate electrode 49 and the floating gate 32. To the contrary, the top gate pattern 30 and the bottom gate pattern 24 are electrically connected. The method for electrically connecting the top gate pattern 30 and the bottom gate pattern 24 is disclosed in U.S. Pat. Nos. 4,780,431 and 6,221,717, the contents of which are incorporated herein by reference.

Referring to FIG. 2, the device isolation layer 4 is formed on the semiconductor substrate 10 to define the active regions 2. A gate insulation layer and a first conductive layer are formed on the semiconductor substrate 10. The first conductive layer is patterned to form a first conductive pattern 14. The inter-gate dielectric 16 and a mask layer 18 are sequentially formed on the semiconductor substrate 10 including the first conductive pattern 14. The mask layer 18 and the inter-gate dielectric 16 are sequentially patterned to form an opening 20 exposing the first conductive pattern 14. Although not shown, the opening 20 crosses over the active regions 2. The opening 20 is positioned in the center of region (S) where a selection line (SL) is to be formed (FIG. 3).

Referring to FIG. 3, a second conductive layer is formed on the mask conductive layer 18 including the opening 20. The second conductive layer, the mask conductive layer 18, the inter-gate dielectric 16 and the first conductive pattern 14 are sequentially patterned to form the word line (WL) and the selection line (SL). The word line (WL) comprises the floating gate 34, a first inter-gate dielectric 36, a first mask conductive layer 38 and the control gate electrode 40. The selection line (SL) comprises the bottom gate pattern 24, a second inter-gate dielectric 26, a second mask conductive layer 28 and a top gate pattern 30. While the floating gate 34 and the control gate electrode 40 are electrically insulated, the bottom gate pattern 24 and the top gate pattern 30 are electrically connected to each other through the opening 20. The width of the opening 20 may be half of the width of the selection line (L). In this case, a permitted misalignment of the opening 20 and the selection line (SL) is L/4.

Referring to FIG. 4, when the opening 20 or the selection line (SL) misaligns, a portion 46 of the opening 20 is placed outside of a selection line region (S).

Referring to FIG. 5, the second conductive layer is formed. Then, the second conductive layer and the mask conductive layer are patterned using the inter-gate dielectric as an etch stop layer to form the control gate electrode 40, the top gate pattern 30, and the first and second mask conductive layers 38 and 28. In this case, the first conductive pattern 14 is removed to expose the gate insulation layer 12 in the opening region 46 placed outside of the selection line region (S).

Referring to FIG. 6, the inter-gate dielectric 16 and the first conductive pattern 14 are patterned to form the floating gate 34, the bottom gate pattern 24, and the first and second inter-gate dielectrics 36 and 26. In this case, the substrate of the opening region 20 can be damaged by etching. Worse yet, a notch 48 can be formed adjacent the selection line (SL).

SUMMARY OF THE INVENTION

In one embodiment of the present invention, a semiconductor device comprises a memory gate pattern and a selection gate pattern separated from each other and arranged on a semiconductor substrate. The memory gate pattern comprises a tunnel dielectric layer, a floating gate, a first inter-gate dielectric and a control gate electrode, which are sequentially stacked. The selection gate pattern comprises a gate dielectric layer, a bottom gate pattern, a second inter-gate dielectric and a top gate pattern. The width of the second inter-gate dielectric is narrower than the width of the bottom gate pattern.

BRIEF DESCRIPTION OF THE DRAWINGS

The above objects and advantages of the present invention will become more apparent by describing in detail preferred embodiments thereof with reference to the attached drawings in which:

FIGS. 8A through 12A are cross-sectional views showing a portion of the cell array for illustrating the method for fabricating the EEPROM according to a preferred embodiment of the present;

FIGS. 8B through 12B are cross-sectional views taken along IV-IV of FIGS. 8A through 12A, respectively;

FIGS. 8C through 12C are cross-sectional views of the peripheral circuit transistor for illustrating the method for fabricating EEPROM according to a preferred embodiment of the present invention; and FIGS. 8D through 12D are cross-sectional view taken along line V-V of FIGS. 8C through 12C, respectively.

DETAILED DESCRIPTION OF THE INVENTION

Figure 1:
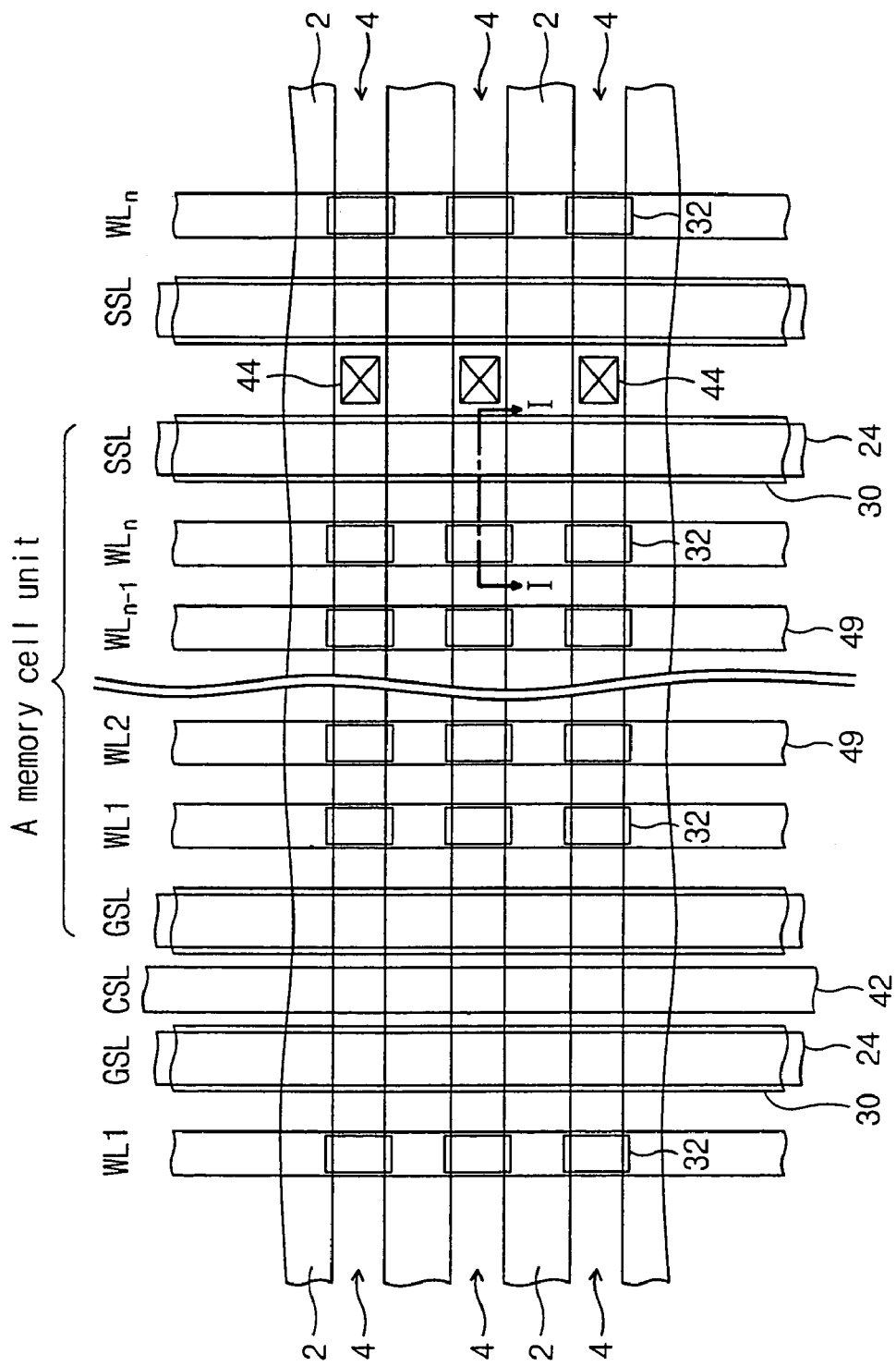
FIG. 1 is a plan view showing a cell array of a conventional NAND flash memory.
Figure 2:
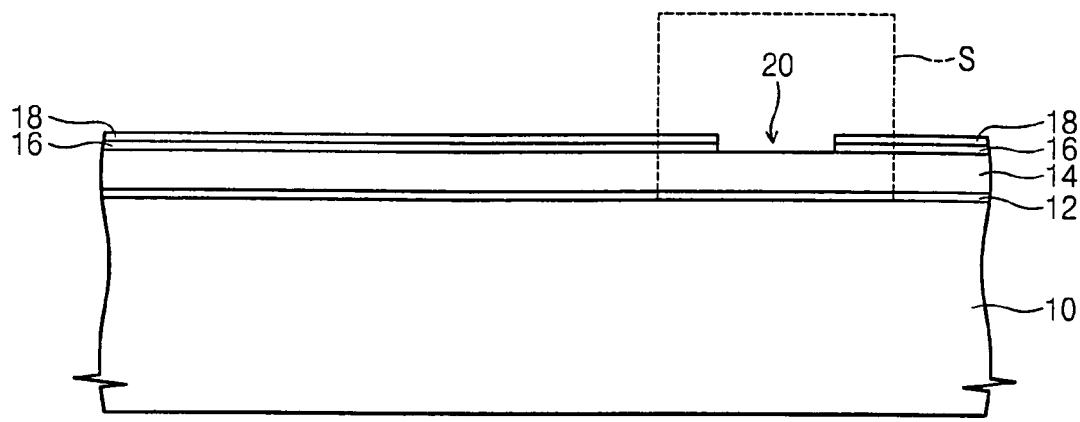
FIG. 2 and FIG. 3 are cross-sectional views illustrating a method for fabricating a conventional EEPROM taken along line I-I of FIG. 1.

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention. In the drawings, the thickness of layers and regions are exaggerated for clarity. It will also be understood that when a layer is referred to being "on" another layer or substrate, it can be directly on the other layer or substrate or intervening layers may be also be present. Like numbers refer to like elements throughout the specification.

Figure 7A:
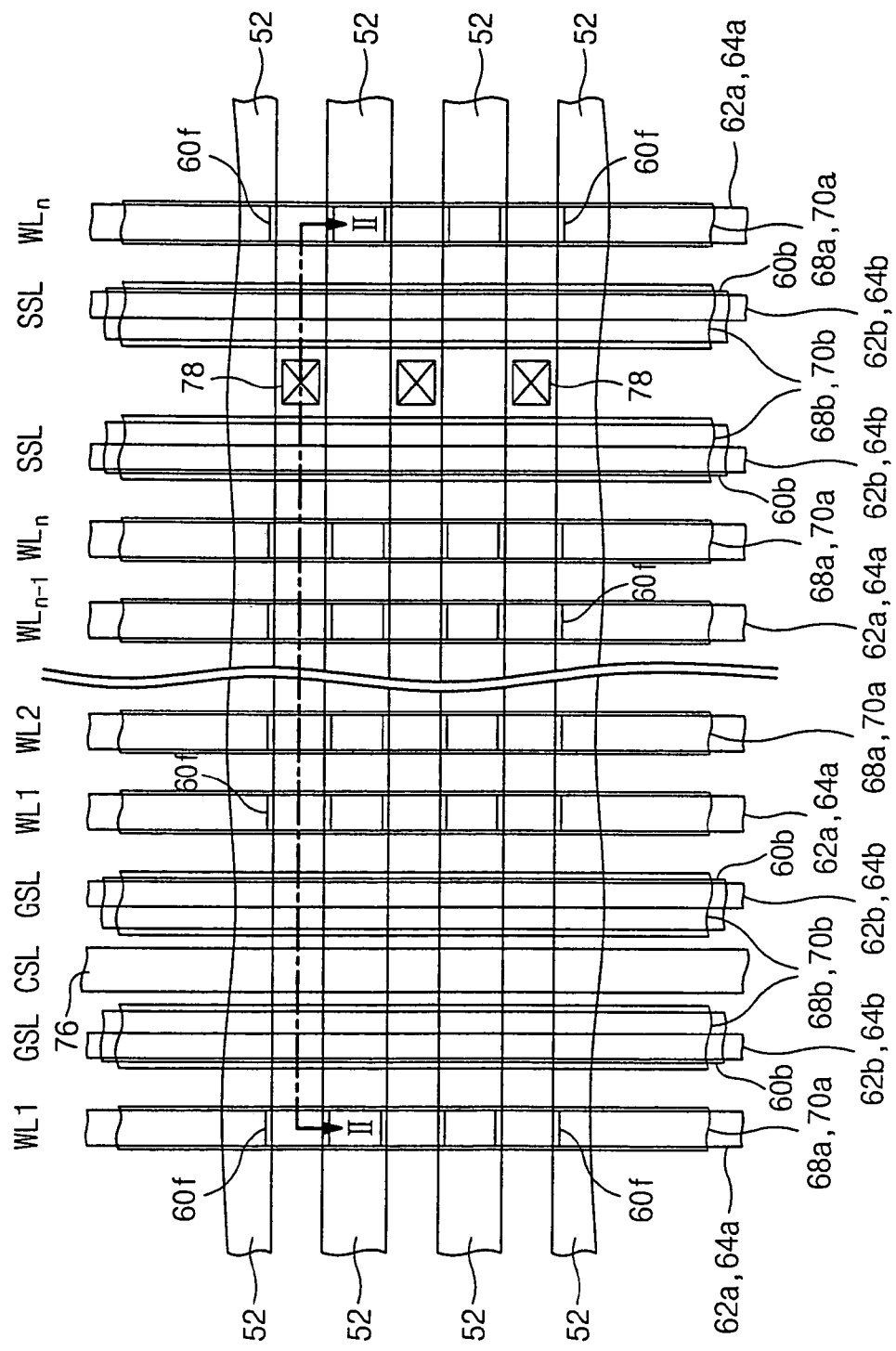
FIG. 7A is a plan view of a portion of the EEPROM cell array of the NAND flash memory for illustrating the EEPROM according to a preferred embodiment of the present invention.
Figure 7B:
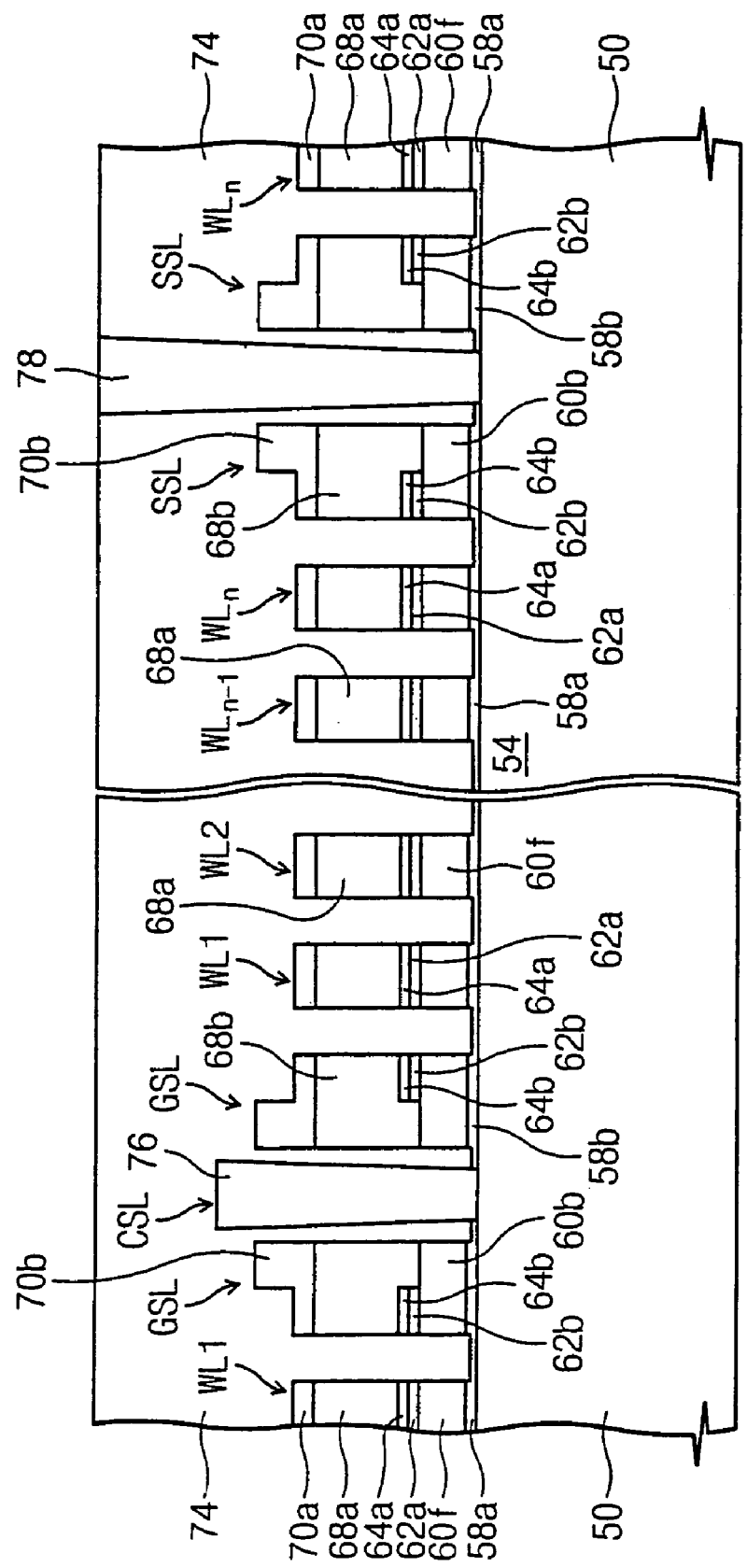
FIG. 7B is a cross-sectional view of the EEPROM cell array of the NAND flash memory taken along line II-II of FIG. 7A.

Referring to FIG. 7A and FIG. 7B, the cell array of a non-volatile memory device such as EEPROM includes a device isolation layer 52 defining a plurality of first active regions 54 in a semiconductor substrate 50. A ground selection line (GSL) and a string selection line (SSL) extend across the first active regions 54. A plurality of parallel word lines (WL) are disposed between the ground selection line (GSL) and the string selection line (SSL) to extend across the first active regions 54. A memory cell unit comprises the ground selection line (GSL), the string selection line (SSL) and the word lines (WL) disposed there between. The cell array includes a plurality of memory cell units. Neighboring memory cell units are arranged symmetrically with respect to each other. A common source line (CSL) is arranged between neighboring ground selection lines (GSL). A bit line plug 78 is connected to the first active region 54 between adjacent string selection lines (SSL). The common source line (CSL) is arranged in parallel to the word line (WL) and the selection line (SSL). As a result, the common source line (CSL) crosses over the first active regions 54. The first active regions 54 are electrically connected in parallel to the common source line (CSL).

The word line (WL) comprises a control gate electrode 68a and floating gates 60f. The control gate electrode 68a crosses over the first active regions 54, and the floating gates 60f are disposed between the first active region 54 and the control gate electrode 68a. A first inter-gate dielectric 62a is disposed between the floating gates 60f and the control gate electrode 68a, thereby electrically isolating the floating gate 60f and the control gate electrode 68a from each other. The first inter-gate dielectric 62a aligns with the control gate electrode 68a to extend across the first active regions 54.

The ground selection line (GSL) and the string selection line (SSL) each comprise a top gate pattern 68b and a bottom gate pattern 60b. The top and bottom gate patterns 68b and 60b extend across the first active regions 54. A second inter-gate dielectric 62b is disposed between the top and bottom gate patterns 68b and 60b. The second inter-gate dielectric 62b extends from one sidewall of each selection line toward the approximately center thereof. Since the width of the second inter-gate dielectric 62b is narrower than that of each selection line, the top and bottom gate patterns 68b and 60b can be electrically connected to each other.

A first hard mask pattern 70a and a second hard mask pattern 70b may be further formed on the control gate electrode 68a and the top gate pattern 68b, respectively. In addition, a first mask conductive pattern 64a and a second mask conductive pattern 64b may be additionally formed on the first inter-gate dielectric 62a and the second inter-gate dielectric 62b, respectively.

An interlayer insulating layer 74 overlies the word lines (WL), the ground selection line (GSL) and the string selection line (SSL) formed on the semiconductor substrate 10. The common source line (CSL) and the bit line plug 78 may be formed in the interlayer insulating layer 74.

A tunnel dielectric layer such as a tunnel oxide layer 58a is disposed between the floating gate 60f and the first active region 54. A gate dielectric layer such as a gate oxide layer 58b is disposed between the bottom gate pattern 60b and the first active region 54.

Figure 7C:
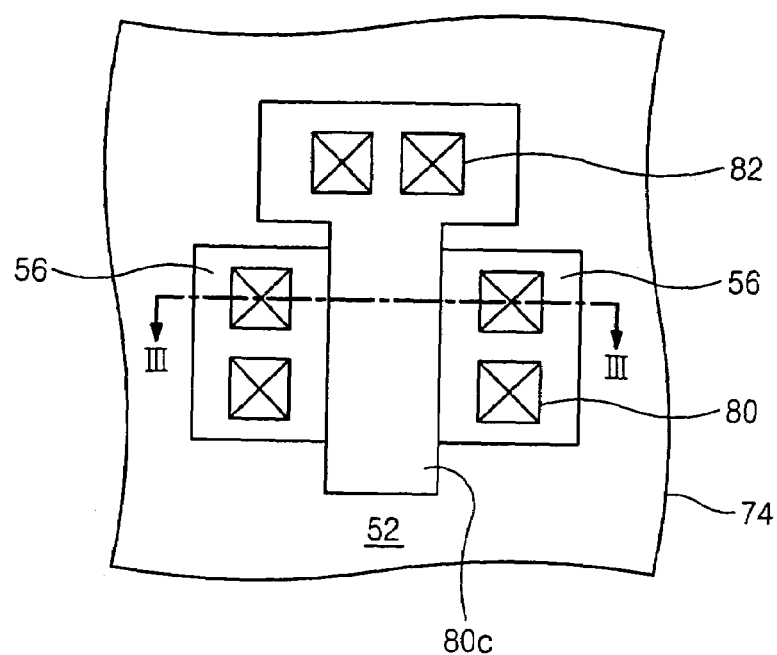
FIG. 7C is a cross-sectional view showing a peripheral circuit transistor for illustrating the EEPROM according to a preferred embodiment of the present invention.
Figure 7D:
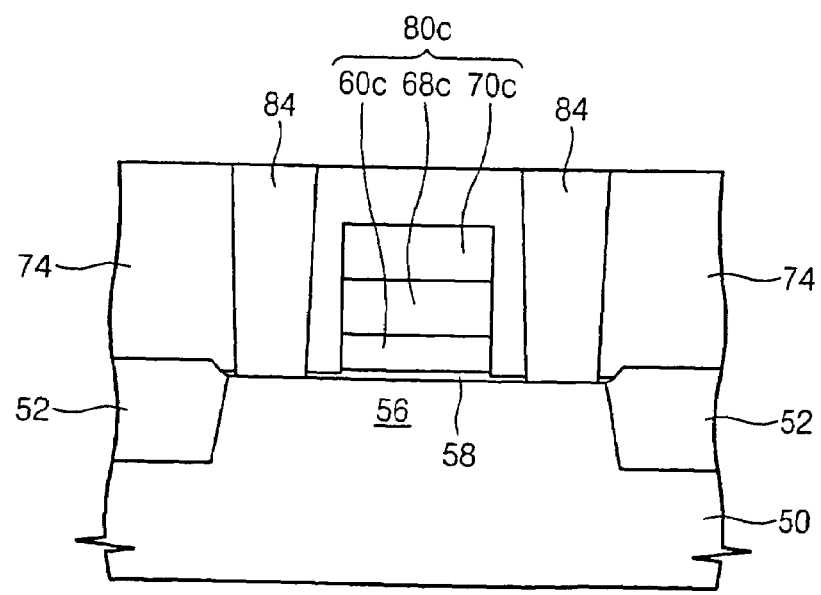
FIG. 7D is a cross-sectional view of the peripheral circuit transistor taken along line II-II of FIG. 7C.
Figure 8B:
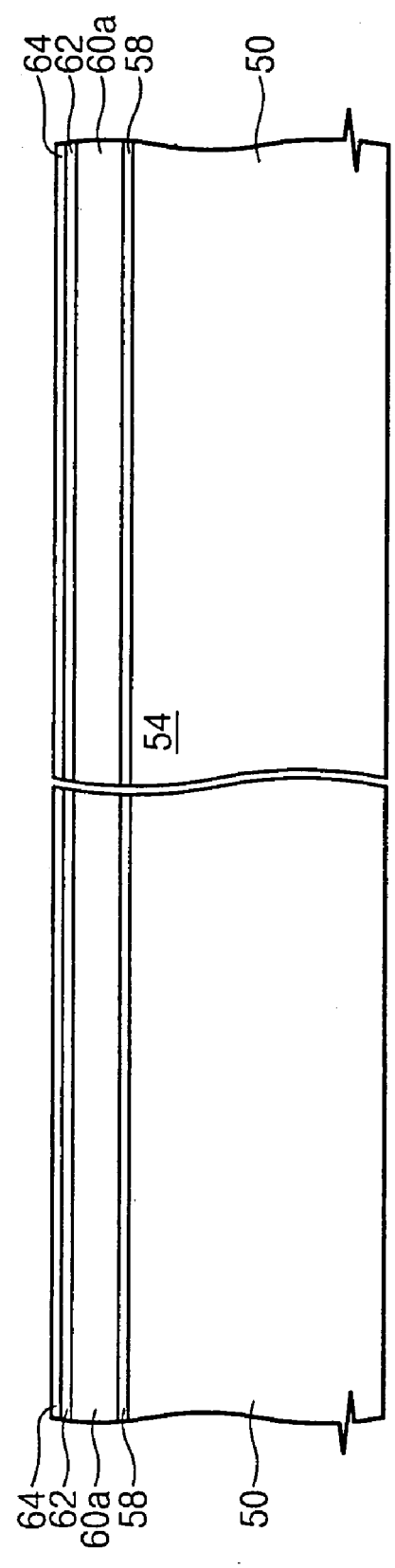
Figure 8C:
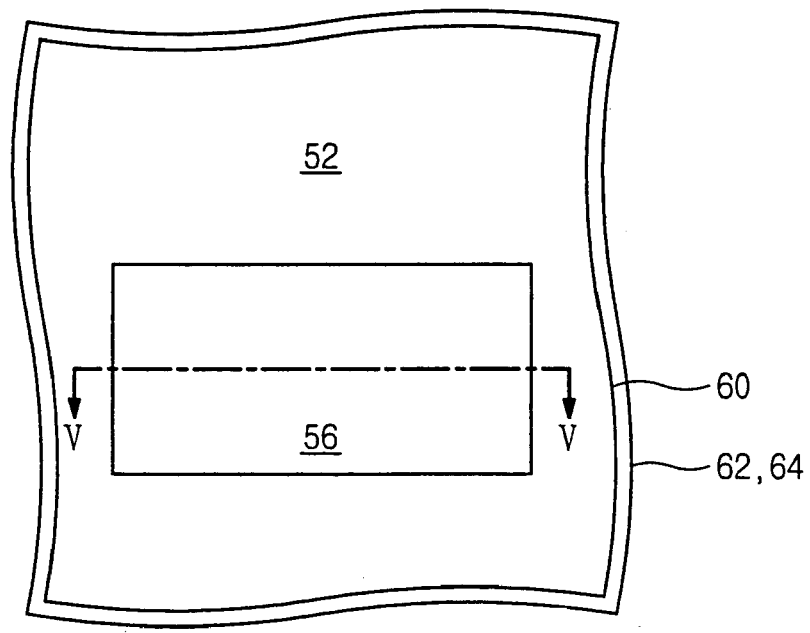
Figure 8D:
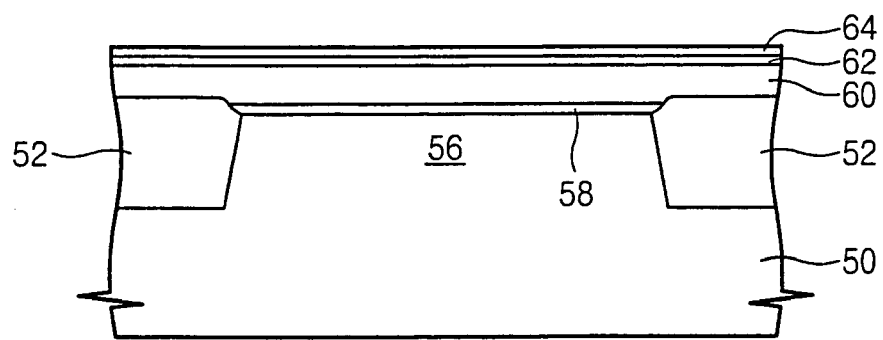
Figure 9A:
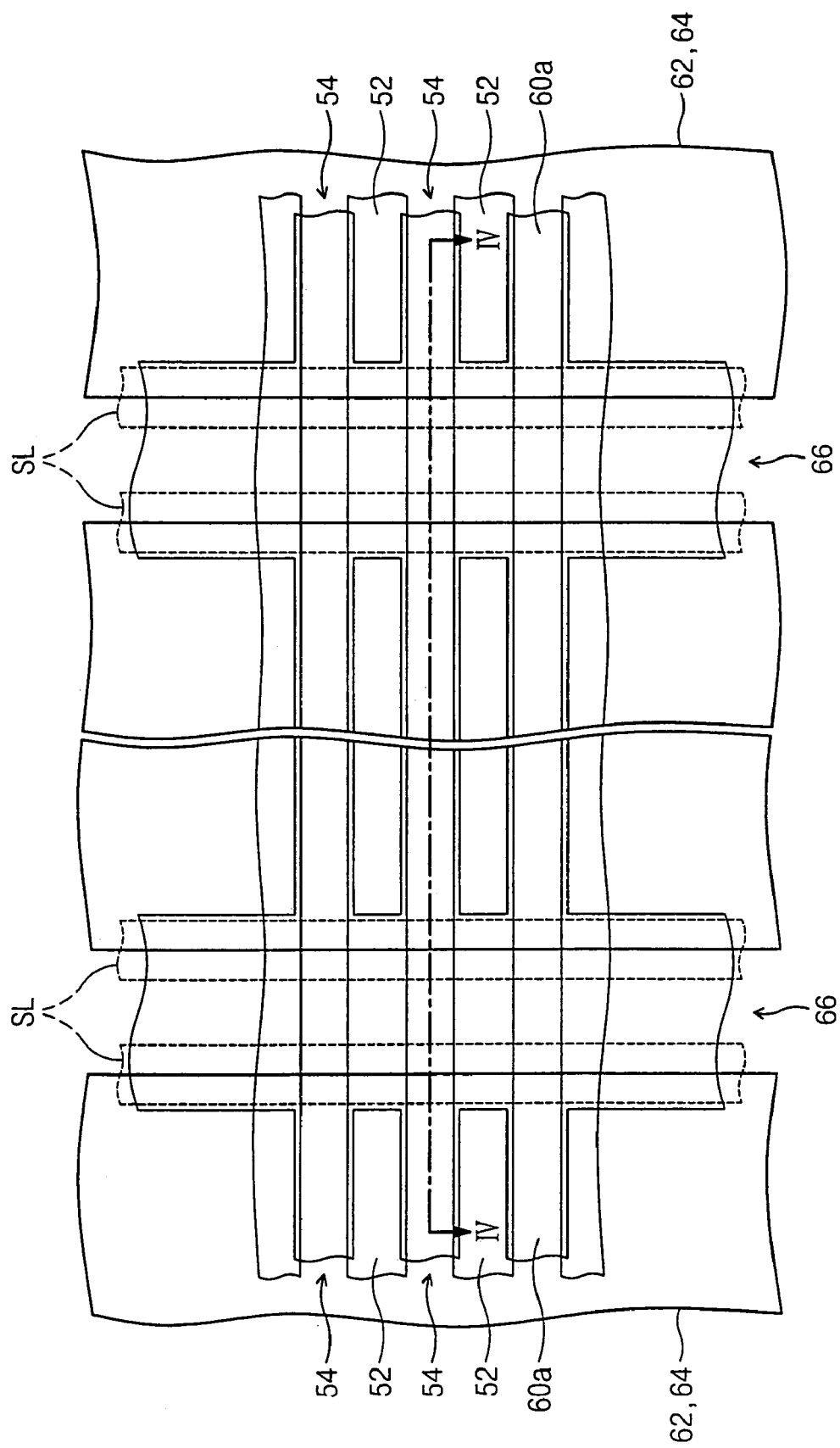
Figure 9C:
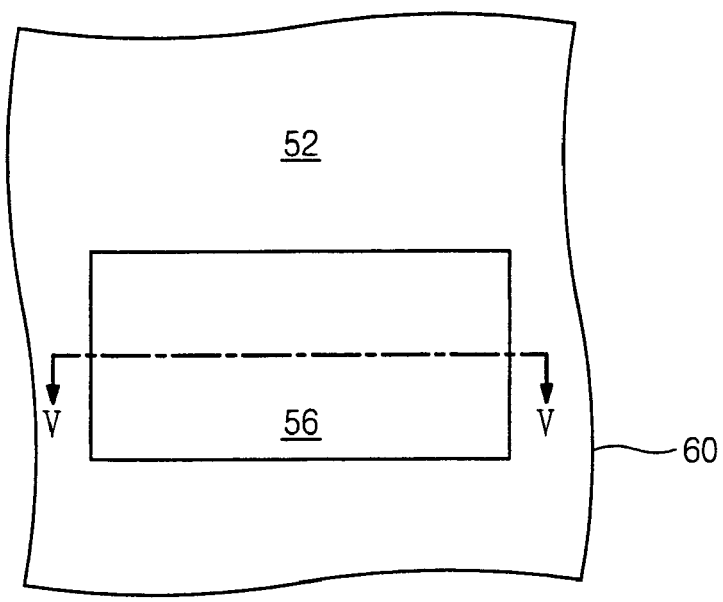
Figure 9D:
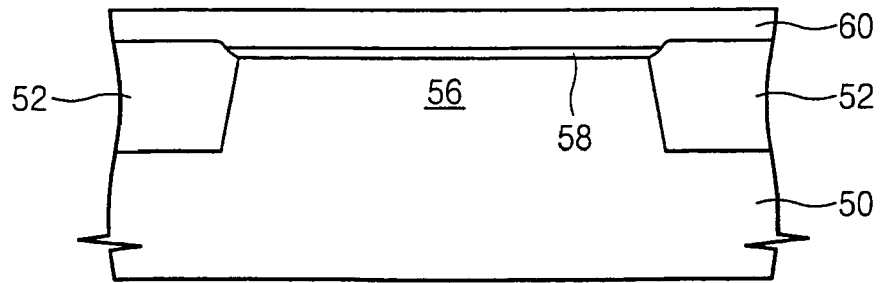
Figure 10B:
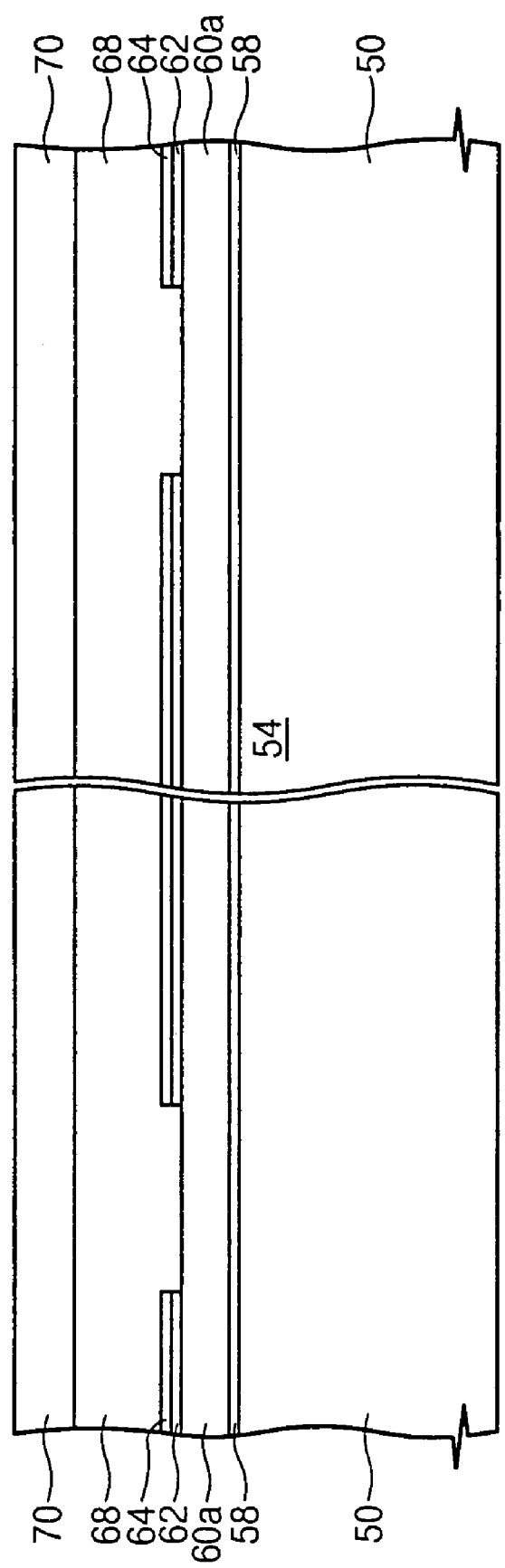
Figure 10C:
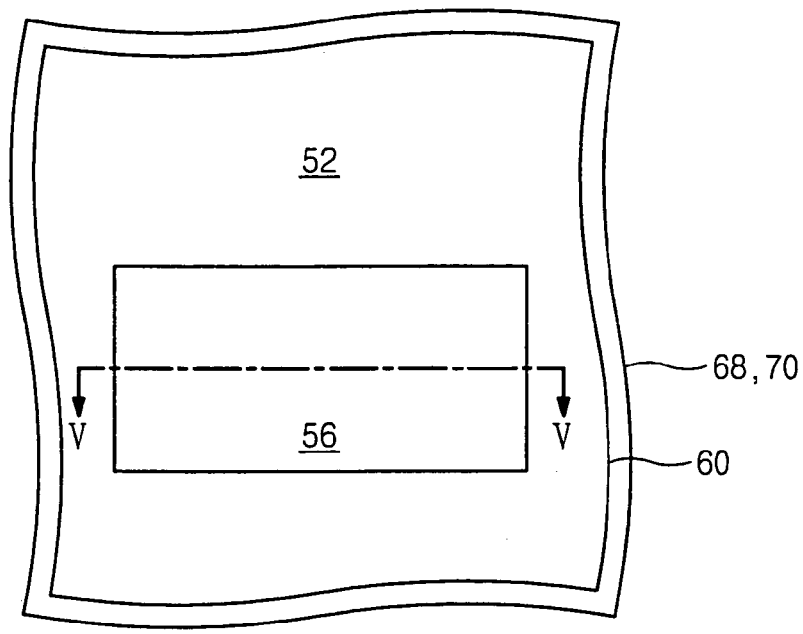
Figure 10D:
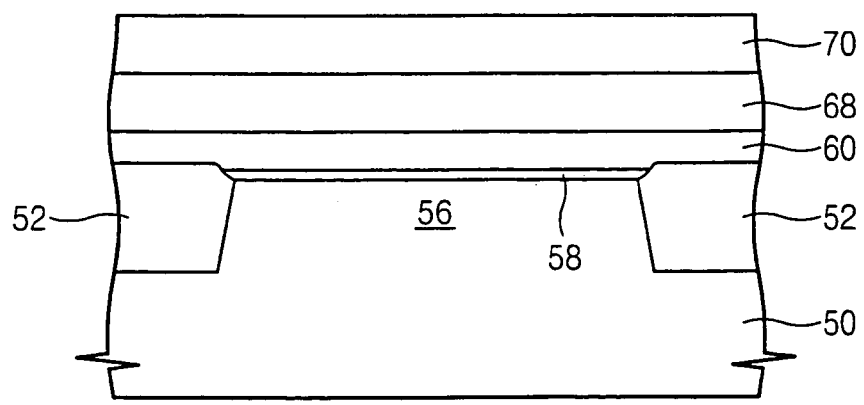
Figure 11A:
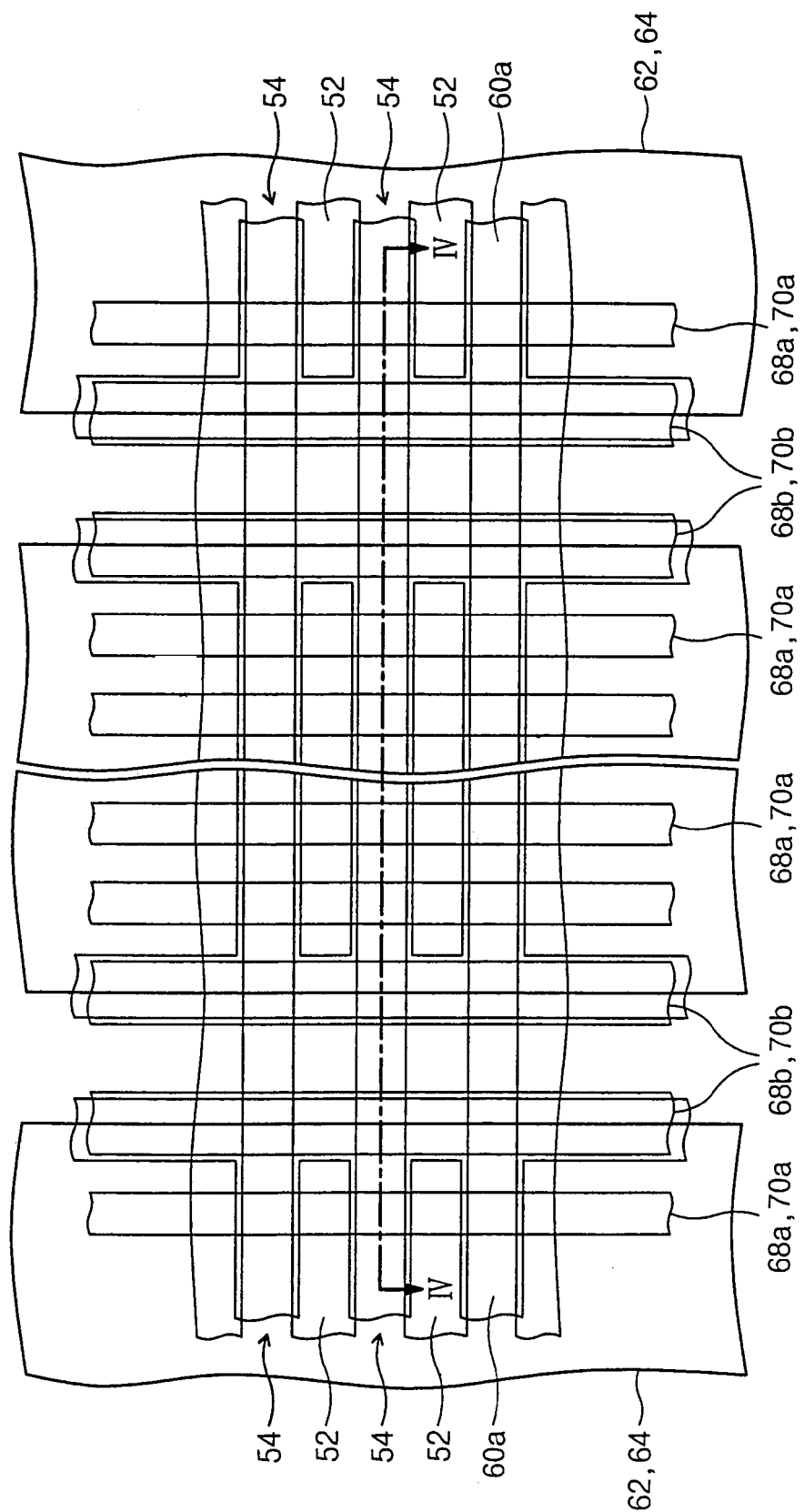
Figure 11B:
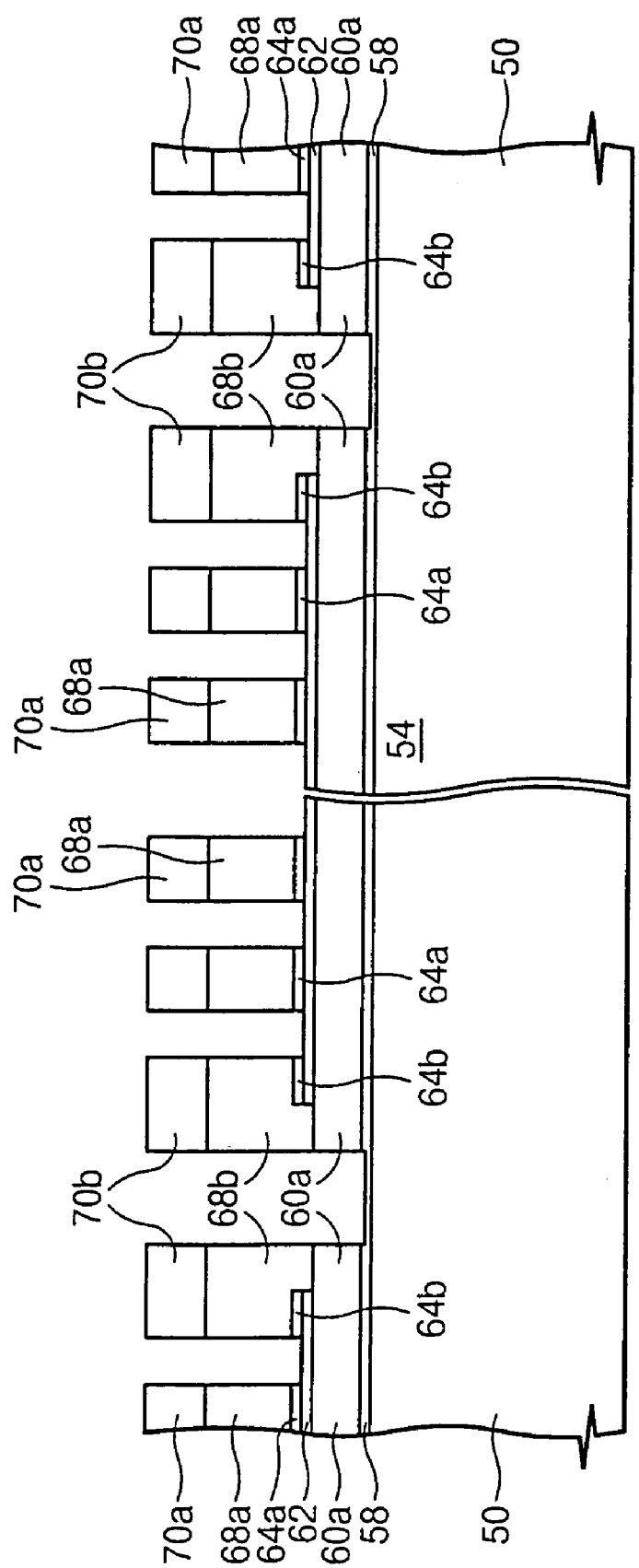
Figure 11C:
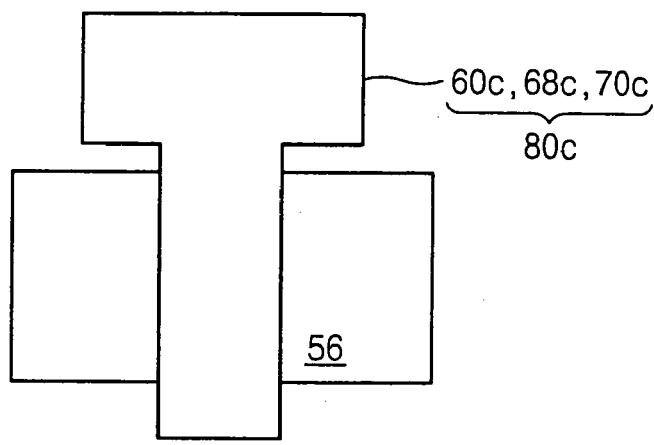
Figure 11D:
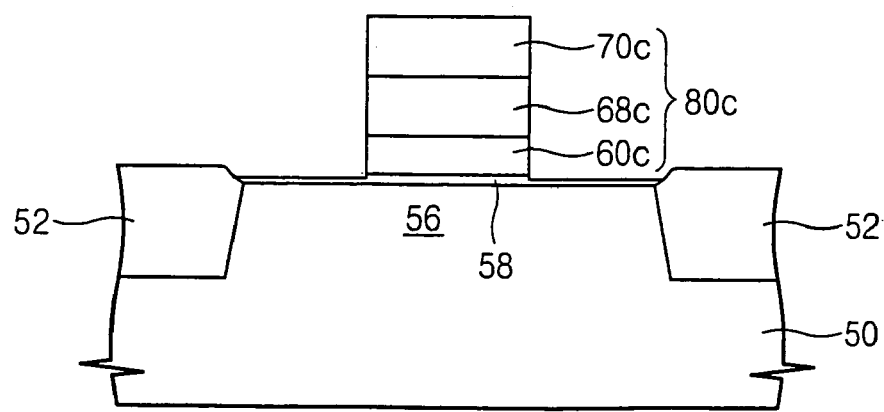

Referring to FIG. 7C and FIG. 7D, the device isolation layer 52 is formed in the peripheral circuit region of EEPROM to define a second active region 56. A peripheral gate electrode 80c extends across the active region 56. The peripheral gate electrode 80c (FIG. 7D) comprises a bottom conductive pattern 60c and a top conductive pattern 68c, which are sequentially stacked. A hard mask pattern 70c may be additionally formed on the top conductive pattern 68c. The bottom conductive pattern 60c may be formed of the same material as that of the floating gate 60f and the bottom gate pattern 60b. The top conductive pattern 68c may be formed of the same material as that of the control gate electrode 68a and the top gate pattern 68b. Furthermore, the hard mask pattern 70c may be formed of the same material as that of the first and second hard mask patterns 70a and 70b. A gate insulation layer 58 is disposed between the bottom conductive pattern 60c and the second active region 56. Also, the interlayer insulating layer 74 is formed in the peripheral circuit region. A plug 84 is formed on both sides of the peripheral circuit gate electrode 82. The plug 84 is connected to the second active region 56 in the interlayer insulating layer 74. Also, the gate plug 82 is connected to the peripheral circuit gate electrode 80c.

Referring to FIGS. 8A-8D, the device isolation layer 52 is formed on the semiconductor substrate 50 to define a plurality of the first active regions 54 in the cell array region. The second active region 56 is defined in the peripheral circuit region. The gate insulation layer 58 is formed on the first and second active regions 54 and 56. A first conductive layer 60 is formed on the semiconductor substrate 10 including the first and second active regions 54 and 56. The first conductive layer 60 is patterned to form a first conductive pattern 60a over the first active regions 54. The first conductive pattern 60a has two parts, i.e., one part being parallel to the first active regions 54, and the other part intersecting the first active regions 54. The intersecting part of the conductive pattern 60a covers a portion of the substrate 50 including the selection line region (SL), in which the string selection line (SSL) and the ground selection line (GSL) are formed. The first conductive layer 60 of the peripheral circuit region may be left without being patterned as described above.

An insulating layer 62 is preferably conformally formed on the semiconductor substrate 50 including the first conductive pattern 60a. The mask conductive layer 64 can be further formed on the insulating layer 62. The insulating layer 62 may be formed of a material having a high dielectric constant, such as an oxide-nitride-oxide layer (ONO) or a metal oxide layer. Preferably, the dielectric constant of the insulating layer 62 is higher than that of a silicon oxide layer. It is preferable that the mask conductive layer is formed to a thickness of between about 100 and about 200 Angstroms using, for example, a polysilicon layer. The mask conductive layer 64 protects the insulating layer 62.

Referring to FIGS. 9A, 9B, 9C and 9D, the mask conductive layer 64 and the insulating layer 62 are patterned to form an opening 66 extending therethough. The opening 66 expose a portion of the first conductive pattern 60a and crosses over the first active regions 54. The opening 66 is formed to overlap a couple of the selection line region (SL) adjacent to each other. In other words, it is preferable that boundaries of both sides of the opening 66 are placed at the center of the selection line region. In this case, the mask conductive layer 64 of the peripheral circuit region and the insulating layer 62 are removed to expose the first conductive layer 60.

Referring to FIGS. 10A, 10B, 10C and 10D, a second conductive layer 68 is formed on the patterned insulating layer 62 and on the exposed portion of the first conductive pattern 60a through the opening 66. The second conductive layer 68 may comprise polysilicon. Also, a metal silicide layer having low resistance can be further formed on the polysilicon layer. Furthermore, a hard mask layer 70 can be additionally formed on the second conductive layer 68.

Referring to FIGS. 11A, 11B, 11C and 11D, a photoresist pattern is formed on the semiconductor substrate 50. The photoresist pattern defines the peripheral gate electrode, the word line and the selection line. The hard mask layer 70, the second conductive layer 68, the mask conductive layer 64, the first conductive pattern 60a of the cell region and the first conductive layer 60 of the peripheral circuit region are sequentially patterned, using the photoresist pattern as an etching mask. As a result, the top gate patterns 68b and a plurality of parallel control gate electrodes 68a, which extend across the first active regions 54, are formed. In this case, the insulating layer 62 is used as an etch stopping layer. Accordingly, the first conductive pattern 60a in the opening 66 is etched in alignment with sidewalls of the top gate pattern 68b. As a result, a first mask conductive pattern 64a is formed under the control gate electrode 68a, and a second mask conductive pattern 64b is formed under the top gate pattern 68b. The top gate pattern 68b is partially in contact with the first conductive pattern 60a.

In one embodiment of the present invention, the first active region 54 and the second active region 56 are protected by the gate insulation layer 58 during etching of the first conductive layer 60 and the first conductive pattern 60a. The first hard mask pattern 70a and the second hard mask pattern 70b are formed on the control gate electrode 68a and the top gate pattern 68b, respectively.

Referring to FIGS. 12A, 12B, 12C and 12D, the photoresist pattern 72 is formed. The photoresist pattern 72 covers the peripheral circuit region and a gap region between the top gate patterns 68c. Also, the photoresist pattern 72 covers a portion of the top gate pattern 68c. The insulating layer 62 and the first conductive pattern 60a are patterned, using the photoresist pattern 72 as an etching mask, to form a first inter-gate dielectric 62a and the floating gate 60f, and the second inter-gate dielectric 62b and the bottom gate pattern 60b. The first inter-gate dielectric 62a and the floating gate 60f align with the control gate electrode 68a. The second inter-gate dielectric 62b and the bottom gate pattern 60b align with the top gate pattern 68b. The word line of a NAND-type cell array may include the floating gate 60f, the first inter-gate dielectric 62a and the control gate electrode 68a. In addition, the ground selection line (GSL) and the string selection line (SSL) include the bottom gate pattern 60b, the second inter-gate dielectric 62b and the top gate pattern 68b.

The floating gate are separated from each other on the first active region 54. The first gate inter-gate dielectric 62a aligns with the control gate electrode 68a to extend across the first active regions 54. The floating gate 60f extends on the device isolation layer 52. The bottom gate pattern 60b aligns with the top gate pattern 68b to extend across the first active regions 54. The second inter-gate dielectric 62b crosses over the first active regions 54. However, the width of the second inter-gate dielectric 62b is narrower than that of the top gate pattern 68b. In other words, if sidewalls of the opening 66 are disposed at the center of the selection line, the width of the second inter-gate dielectric is about half of the width of the top gate pattern 68b. The second inter-gate dielectric 62b has a sidewall that is aligned with a sidewall of the top gate pattern 68b and extended in a lateral direction toward the approximately center of the top gate pattern 68b.

As mentioned in the previous embodiment, the present invention can be applicable to a NAND-type flash memory device. Furthermore, the present invention can also be applicable to a FLOTOX EEPROM such as one having memory transistors and selection transistors. This may be summarized as follows: the word line of the present invention may be equivalent to the gate electrode of memory transistors of the FLOTOX EEPROM. The selection line of the present invention may be equivalent to the gate line of selection transistors of FLOTOX EEPROM.

According to an embodiment of the present invention, with partially removed inter-gate dielectric included in a selection line, a bottom gate pattern and a top gate pattern can be electrically connected. The inter-gate dielectric at a predetermined region may be removed. Both boundaries of the predetermined region are overlapped with two selection lines neighboring it, respectively. As a result, the width of inter-gate dielectric is narrower than that of the selection line, and one sidewall of the inter-gate dielectric aligns with one sidewall of the selection line (SL).

Figure 3:
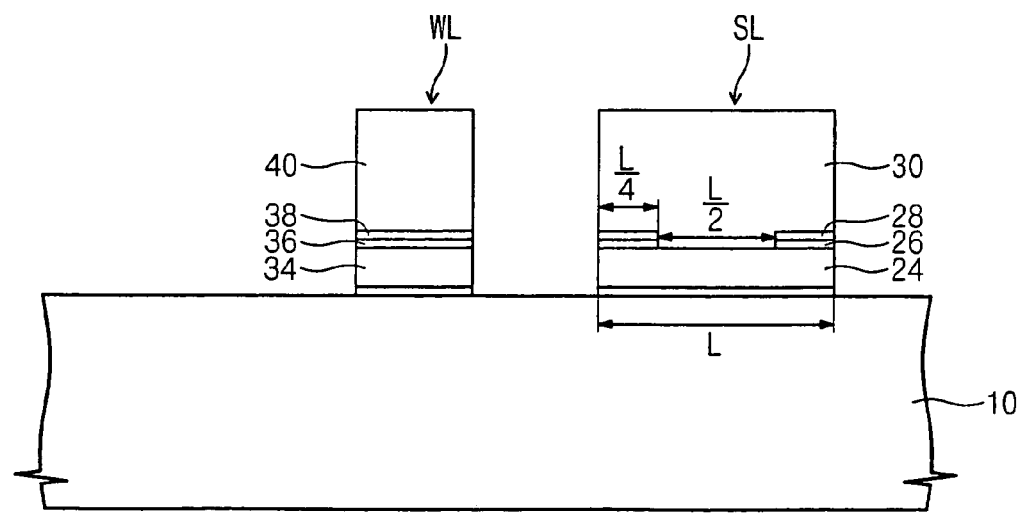
Figure 4:
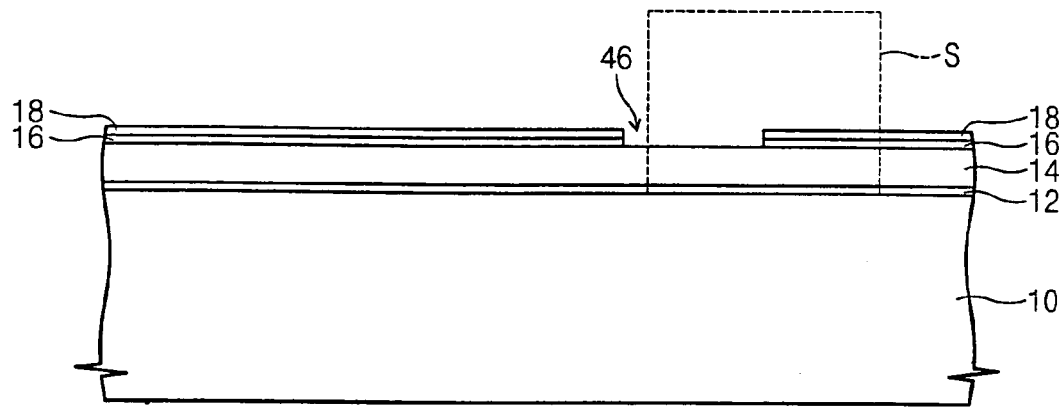
FIGS. 4 through 6 are cross-sectional views illustrating problems of the conventional EEPROM.
Figure 5:
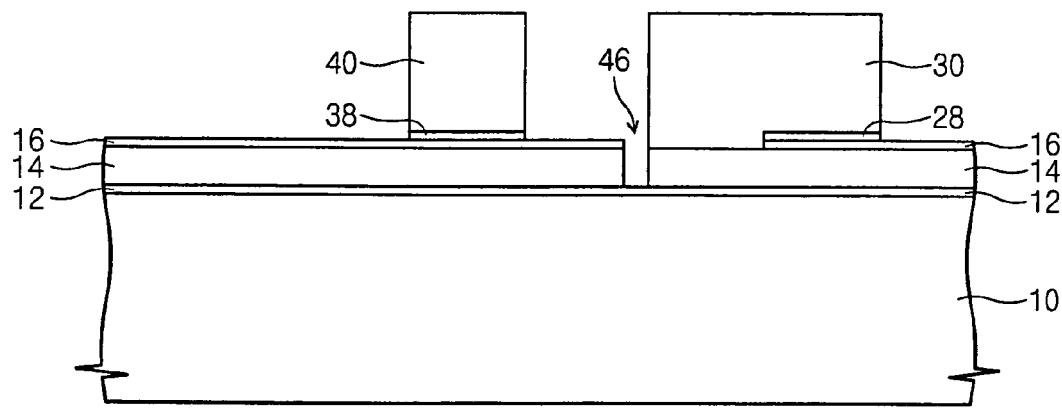
Figure 6:
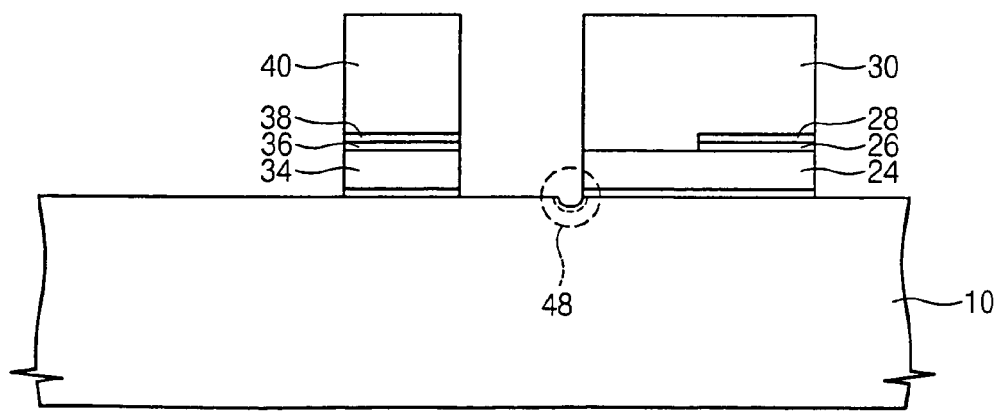
Figure 12A:
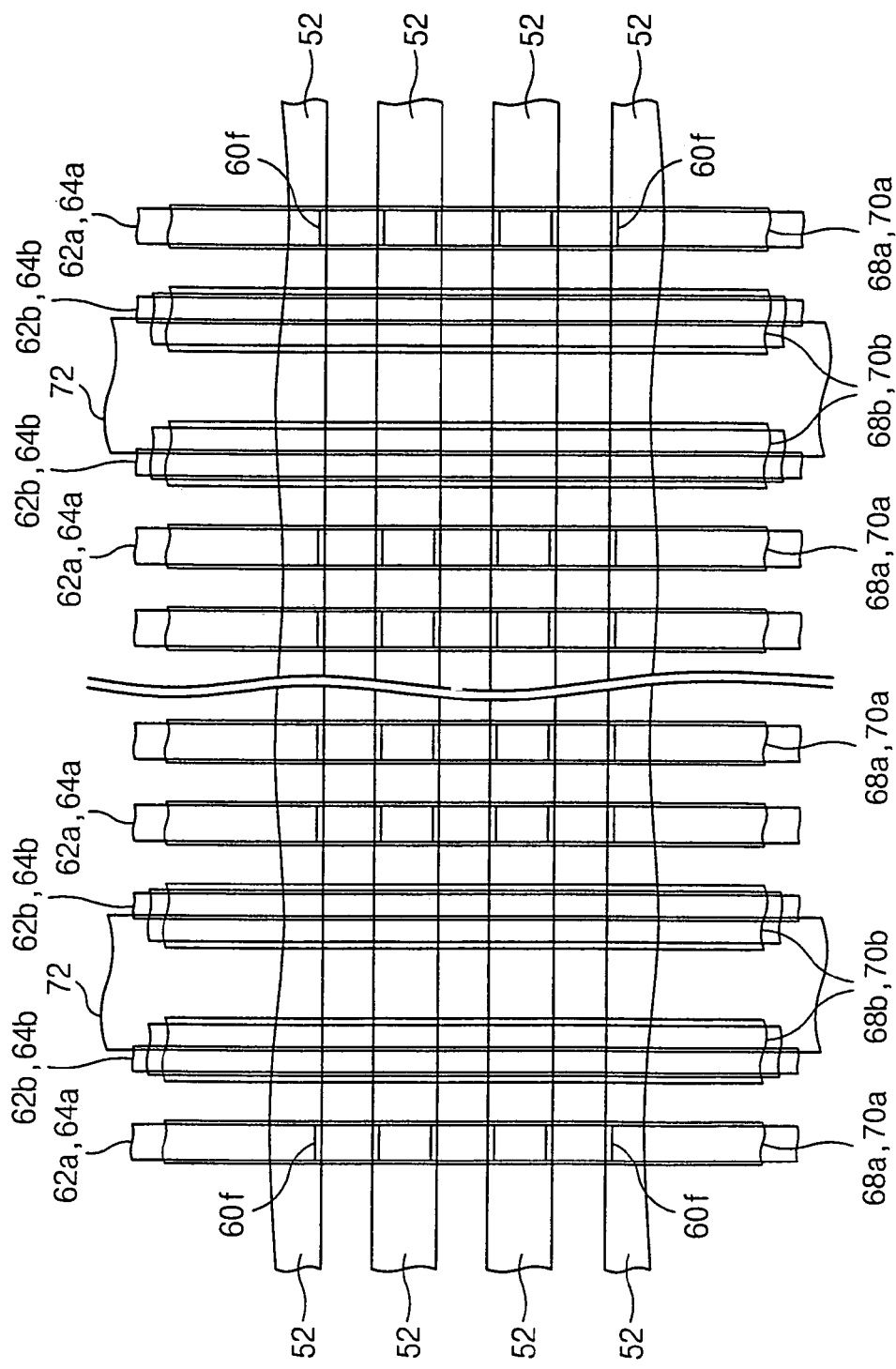
Figure 12B:
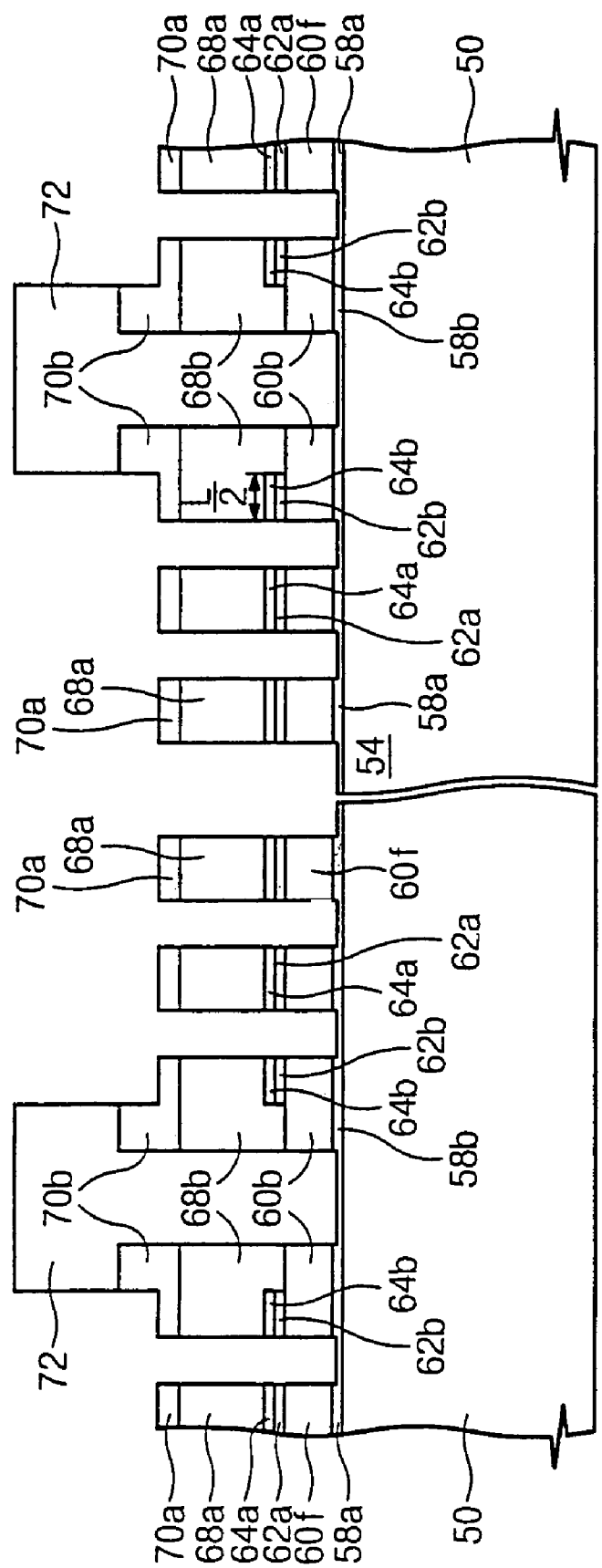
Figure 12C:
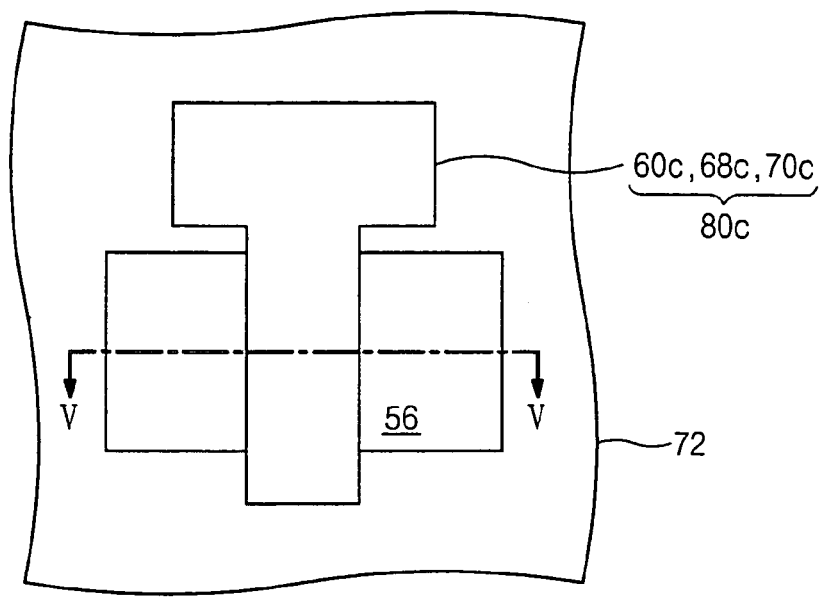
Figure 12D:
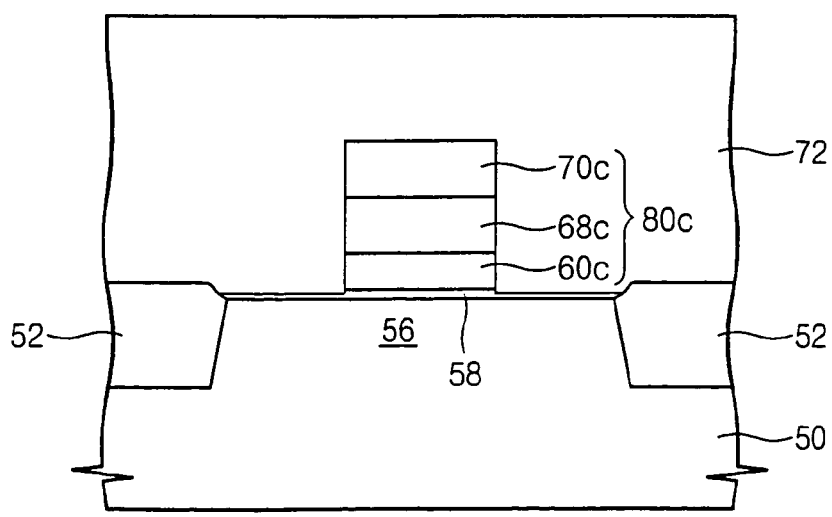

According to the prior art, when the contact width of the top gate pattern and the bottom gate pattern is half of the selection line (SL), as shown in FIG. 3, a permitted misalignment may be L/4. However, as shown in FIG. 12B according to an embodiment of the present invention, the permitted misalignment may be L/2. Therefore, the permitted alignment can be increased when the top gate pattern and the bottom gate pattern have the same contact dimension. For example, if error is L/4 in fabricating process, according to the present invention, the contact dimension of the top gate pattern and the bottom gate pattern can be increased, thereby improving signal transmission speed.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a non-volatile memory device, the method comprising:
    forming a device isolation layer on a semiconductor substrate to define a plurality of active regions;
    forming a first conductive layer on the plurality of active regions;
    patterning the first conductive layer to form a first conductive pattern on the active regions;
    forming an insulating layer on the first conductive pattern;
    patterning the insulating layer to form an opening extending therethrough, the opening exposing a portion of the first conductive pattern;
    forming a second conductive layer on the patterned insulating layer and on the exposed portion of the first conductive pattern through the opening; and
    forming a selection gate pattern according to a method comprising:
    sequentially patterning the second conductive layer and the first conductive pattern to form a top gate pattern; and
    after sequentially patterning the second conductive layer and the first conductive pattern, patterning the patterned insulating layer and the patterned first conductive pattern to form an inter-gate dielectric and a bottom gate pattern, respectively, wherein the width of the inter-gate dielectric is narrower than the width of the bottom gate pattern.

2. The method for fabricating a non-volatile memory device of claim 1, wherein the top gate pattern is partially overlapped with the opening to extend across the active regions, the top gate pattern extending in parallel to the opening.

3. The method for fabricating a non-volatile memory device of claim 1,
    wherein the inter-gate dielectric extends from one sidewall of the selection gate pattern to approximately center thereof.

4. The method for fabricating a non-volatile memory device of claim 1, wherein the top gate pattern is electrically connected to the bottom gate pattern.

5. The method for fabricating a non-volatile memory device of claim 1, further comprising forming a mask conductive layer on the insulating layer, wherein the opening is formed by sequentially patterning the mask conductive layer and the insulating layer.

6. The method for fabricating a non-volatile memory device of claim 5, wherein sequentially patterning the second conductive layer and the first conductive pattern comprises:
    patterning the second conductive layer using the insulating layer as an etch stopping layer to form the top gate pattern.

7. The method for fabricating a non-volatile memory device of claim 6, further comprising forming a word line comprising a control gate electrode and a floating gate,
    wherein the control gate electrode is formed while sequentially patterning the second conductive layer and the first conductive pattern to form the top gate pattern, and
    wherein the floating gate is formed while patterning the patterned insulating layer and the patterned first conductive pattern to form the inter-gate dielectric and the bottom gate pattern.

8. The method for fabricating a non-volatile memory device of claim 7, wherein the floating gate and the bottom gate pattern align with the control gate electrode and the top gate pattern, respectively.

9. The method for fabricating a non-volatile memory device of claim 1, wherein the top gate pattern includes a first sidewall and a second sidewall opposite the first sidewall, wherein the first sidewall is over the patterned insulating layer, the method further comprising:
    forming a photoresist pattern covering a portion of the semiconductor substrate adjacent to the second sidewall; and
    patterning the patterned insulating layer and the first conductive pattern to form the inter-gate dielectric and the bottom gate pattern, respectively, using the photoresist pattern as a mask.

10. A method for fabricating a non-volatile memory device, the method comprising:
    forming a device isolation layer on a semiconductor substrate to define a cell region and a peripheral region and to define a plurality of first active regions in the cell region and a second active region in the peripheral region;
    forming a first conductive layer on the semiconductor substrate;
    patterning the first conductive layer in the cell region to form a first conductive pattern on the first active regions;
    forming an insulating layer on the first conductive pattern;
    patterning the insulating layer to form an opening crossing over the first active regions, while exposing a portion of the first conductive layer in the peripheral region;
    forming a second conductive layer overlying the insulating layer; and
    sequentially patterning the second conductive layer, the insulating layer and the first conductive pattern to form a word line, a selection line and a peripheral circuit gate pattern,
    wherein the word line crosses over the first active regions, and
    wherein the selection line is partially overlapped with the opening to extend across the first active region, the selection line extending in parallel to the opening, and
    wherein the peripheral circuit gate pattern crosses over the second active region.

11. A method for fabricating a semiconductor memory device, the method comprising:

forming a first conductive pattern on a semiconductor substrate;

forming an insulating layer on the first conductive pattern;

patterning the insulating layer to form an opening to expose a portion of the first conductive pattern;

forming a second conductive layer on the patterned insulating layer and the first conductive pattern, wherein a portion of the second conductive layer is within the opening;

removing a portion of the second conductive layer within the opening to form a top gate pattern and also removing another portion of the second conductive layer over the patterned insulating layer to expose a portion of the patterned insulating layer;

removing a portion of the first conductive pattern exposed by the opening to form a patterned first conductive pattern, wherein the patterned first conductive pattern includes a sidewall aligned with the sidewall of the top gate pattern; and etching the exposed portion of the patterned insulating layer and a portion of the etched first conductive pattern to form an inter-gate dielectric and a bottom gate pattern, respectively.

* * * * *